United States Patent
Liu et al.

(10) Patent No.: US 8,940,647 B2
(45) Date of Patent: Jan. 27, 2015

(54) METHOD FOR SURFACE TREATMENT ON A METAL OXIDE AND METHOD FOR PREPARING A THIN FILM TRANSISTOR

(75) Inventors: Xiaodi Liu, Beijing (CN); Jun Cheng, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/698,558

(22) PCT Filed: Aug. 22, 2012

(86) PCT No.: PCT/CN2012/080477
§ 371 (c)(1),
(2), (4) Date: Nov. 16, 2012

(87) PCT Pub. No.: WO2013/097472
PCT Pub. Date: Jul. 4, 2013

(65) Prior Publication Data
US 2013/0171836 A1  Jul. 4, 2013

(30) Foreign Application Priority Data
Dec. 28, 2011  (CN) .......................... 2011 1 0447901

(51) Int. Cl.
*H01L 21/31* (2006.01)
*H01L 21/02* (2006.01)
*H01L 21/425* (2006.01)
(Continued)

(52) U.S. Cl.
CPC .......... *H01L 21/0234* (2013.01); *H01L 21/425* (2013.01); *H01L 21/443* (2013.01); *H01L 21/465* (2013.01); *H01L 29/66742* (2013.01); *H01L 29/78618* (2013.01); *H01L 29/7869* (2013.01); *H01L 31/022466* (2013.01)
USPC .................... 438/767; 438/151; 257/E21.085

(58) Field of Classification Search
USPC .......... 438/603, 768; 257/E21.084, E21.365, 257/E21.386
See application file for complete search history.

(56) References Cited

U.S. PATENT DOCUMENTS

2007/0109478 A1  5/2007  Kim
2008/0042288 A1  2/2008  Yamazaki et al.
(Continued)

FOREIGN PATENT DOCUMENTS

CN  101101872 A  1/2008
CN  101417789 A  4/2009
(Continued)

OTHER PUBLICATIONS

Second Chinese Office Action dated Jun. 20, 2013; Appln. No. 201110447901.1.
(Continued)

*Primary Examiner* — Cheung Lee
(74) *Attorney, Agent, or Firm* — Ladas & Parry LLP (57) ABSTRACT

Embodiments of the present invention provide a method for surface treatment on a metal oxide and a method for preparing a thin film transistor. The method for surface treatment on a metal oxide comprises: utilizing plasma to perform a surface treatment on a device to be processed; the plasma comprises a mixture gas of an F-based gas and $O_2$, and the device to be processed is a metal oxide or a manufactured article coated with a metal oxide. The embodiments provided by the present invention can reduce the contact resistance between a metal oxide and other electrodes, and improve the effect of ohmic contact of the metal oxide.

14 Claims, 6 Drawing Sheets

(51) Int. Cl.
*H01L 21/443* (2006.01)
*H01L 21/465* (2006.01)
*H01L 29/66* (2006.01)
*H01L 29/786* (2006.01)
*H01L 31/0224* (2006.01)

(56) References Cited

U.S. PATENT DOCUMENTS

2011/0147734 A1 6/2011 Kim et al.
2011/0291096 A1* 12/2011 Ryoo et al. .................. 257/59

FOREIGN PATENT DOCUMENTS

| | | |
|---|---|---|
| CN | 101478005 A | 7/2009 |
| CN | 101556979 A | 10/2009 |
| CN | 101894760 A | 11/2010 |
| JP | 2000-284326 A | 10/2000 |
| JP | 1020070055384 | 5/2007 |
| JP | 4-522529 B2 | 8/2010 |
| KR | 20110072270 A | 6/2011 |

OTHER PUBLICATIONS

Third Chinese Office Action dated Sep. 4, 2013; Appln. No. 201110447901.1.
I-Min Chan, et al; "Plasma treatments of indium tin oxide anodes in carbon tetrafluorinde ($CF_4$)/Oxygen ($O_2$) to improve the performance of organic light-emitting diodes", Thin Solid Films, vol. 444, Issues 1-2 pp. 254-259; Nov. 2003.
First Chinese Office Action; dated Apr. 1, 2013; Appln. No. 200980104691.7.
International Search Report dated Nov. 29, 2012; PCT/CN2012/080477.
Fourth Chinese Office Action dated Dec. 30, 2013; Appln. No. 201110044790.1.
Korean Office Action dated Nov. 15, 2013; Appln. No. 10-2012-7030282.
Rejection Decision Issued May 6, 2012 Appln. No. 201110447901.1.
Examination Report Issued May 29, 2014 Appln. No. 10-2012-7030282.
International Preliminary Report on Patentability Issued Jul. 1, 2014.

* cited by examiner

METHOD FOR SURFACE TREATMENT ON A METAL OXIDE AND METHOD FOR PREPARING A THIN FILM TRANSISTOR

CROSS REFERENCE TO RELATED APPLICATIONS

This application is a national stage application under 35 U.S.C. 371 and claims the benefit of PCT Application No. PCT/CN2012/080477 having an international filing date of Aug. 22, 2012, which designated the United States, which PCT application claimed the benefit of Chinese Application No. 201110447901.1 filed Dec. 28, 2011, the disclosure of both the above-identified applications are incorporated herein by reference.

TECHNICAL FIELD

Embodiments of the present invention relate to a method for surface treatment on a metal oxide and a method for preparing a thin film transistor.

BACKGROUND

Metal oxides can be widely applied to transparent electrodes, light-emitting diodes, solar cells, gas sensors, as well as the field of displays. In various application fields of metal oxides, the metal oxides are usually required to possess certain electrical characteristics, and the main electrical characteristic parameters comprise carrier concentration, contact resistance, electrical resistivity or the like.

Figure 1:
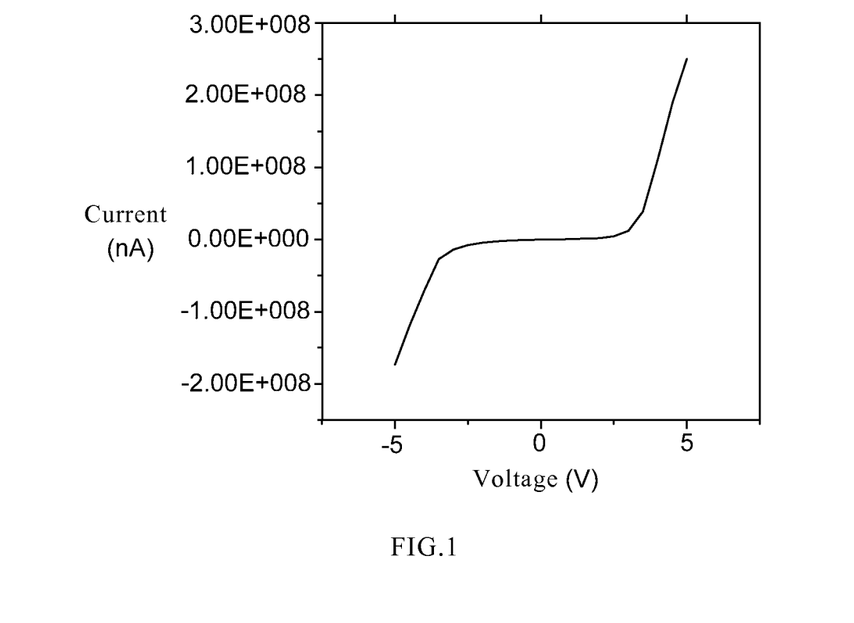
FIG. 1 is an I-V characteristic spectral line of a metal oxide in the prior art.

In order to achieve ohmic contact of metal oxides prepared under different conditions, argon plasma, hydrogen plasma or $N_2O$ plasma can be utilized to perform treatments on the metal oxides so as to improve the ohmic contact of the metal oxides. However, the metal oxides after the above-described plasma treatments do not present good ohmic contact. FIG. 1 is an I-V characteristic spectral line of a metal oxide in the prior art. As shown in FIG. 1, the I-V characteristic spectral line of the metal oxide in the prior art is a curve, indicating that there exists a schottky barrier at the position where the surface of the metal oxide comes into contact with an electrode of metal indium, metal molybdenum or a transparent electrode of indium-tin oxide (ITO) or the like. Therefore, if the metal oxide is formed into a device, the contact resistance between the metal oxide and the electrodes is large, resulting in a relatively high power consumption.

SUMMARY

In order to solve the above-described problems, the embodiments of the present invention provide a method for surface treatment on a metal oxide and a method for preparing a thin film transistor, solving the problem in the prior art that the contact resistance between a metal oxide and an electrode is too large.

To this end, one embodiment of the present invention provides a method for surface treatment on a metal oxide, comprising: utilizing plasma to perform a surface treatment on a device to be processed. The plasma comprises a mixture gas of an F-based gas and $O_2$, and the device to be processed is a metal oxide or a manufactured article coated with a metal oxide.

For example, the device to be processed comprises: zinc oxide, tin oxide, zinc oxide based metal oxide containing at least one element of indium, aluminum and gallium, or tin oxide-based metal oxide containing at least one element of the indium, aluminum and gallium.

For example, said utilizing plasma to perform a surface treatment on a device to be processed specifically comprises: filling a chamber, in which the device to be processed is placed, with the mixture gas of an F-based gas and $O_2$ at pressure Y, the $O_2$ content in the mixture gas being η; and utilizing RF at a power P to act on the mixture gas to obtain plasma; and the time in which the plasma acts on the device to be processed is "t".

For example, the F-based gas comprises at least one gas of $CF_4$, $SF_6$, $NF_3$ and $C_2F_8$.

For example, the F-based gas is $CF_4$; the $O_2$ content η in the mixture gas of $CF_4$ and $O_2$ is in a range of 0-38%; the pressure Y of the mixture gas of $CF_4$ and $O_2$ is in a range of 40-400 mTorr; the time "t" in which the plasma acts on the device to be processed is in a range of 5-120 s; and the power P of the RF is in a range of 200-1500 W.

The method for surface treatment on a metal oxide provided by this embodiment of the invention, by utilizing the plasma obtained from a mixture gas of an F-based gas and $O_2$ to perform a treatment on a metal oxide, can increase the concentration of oxygen vacancy in the metal oxide, reduce the contact resistance between a metal oxide and other electrodes, and improve the effect of ohmic contact of the metal oxide.

Another embodiment of the present invention further provides a method for preparing a thin film transistor, comprising: preparing a gate electrode, a gate insulating layer, a channel layer, a blocking layer, a source electrode, a drain electrode and a passivation protective layer on a substrate in order, the preparation of the channel layer comprises: utilizing plasma to perform a surface treatment on the channel layer; the plasma comprises plasma obtained from a mixture gas of an F-based gas and $O_2$; the material of the channel layer is a metal oxide.

For example, the metal oxide comprises: zinc oxide, tin oxide, zinc oxide based metal oxide layer containing at least one element of indium, aluminum and gallium, or tin oxide-based metal oxide containing at least one element of the indium, aluminum and gallium.

For example, the utilizing plasma to perform surface treatment on the channel layer comprises: placing a product, a surface of which is a channel layer, into a chamber filled with a mixture gas of an F-based gas and $O_2$ at pressure Y, the $O_2$ content in the mixture gas being η; and utilizing RF at a power P to act on the mixture gas to obtain plasma; and the time in which the plasma acts on the device to be processed is "t".

For example, the channel layer comprises a central region and two contact regions for contacting the source-drain respectively, the two contact regions being on both sides of the central region; the blocking layer is deposited in the position of the central region on the channel layer, for blocking plasma from reaching the central region of the channel layer.

For example, the F-based gas is $CF_4$; the $O_2$ content η in the mixture gas of $CF_4$ and $O_2$ is in a range of 0-38%; the pressure Y of the mixture gas of $CF_4$ and $O_2$ is in a range of 40-400 mTorr; the time "t" in which the plasma acts on the device to be processed is in a range of 5-120 s; and the power P of the RF is in a range of 200-1500 W.

The method for preparing a thin film transistor provided by the present invention, during the preparation of the thin film transistor, uses a blocking layer to form a self-aligned structure, and utilizes plasma obtained from a mixture gas of an F-based gas and $O_2$ to perform a treatment on a channel layer, so as to increase the concentration of oxygen vacancy in the channel layer, improve the contact characteristics of the channel layer, and reduce the contact resistance between the channel layer and the source or drain electrode, thereby improving the Hall mobility and e carrier concentration of the channel layer, which facilitates lowering a metal oxide device's power consumption.

BRIEF DESCRIPTION OF THE DRAWINGS

In order to clearly illustrate the technical solutions of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 2:
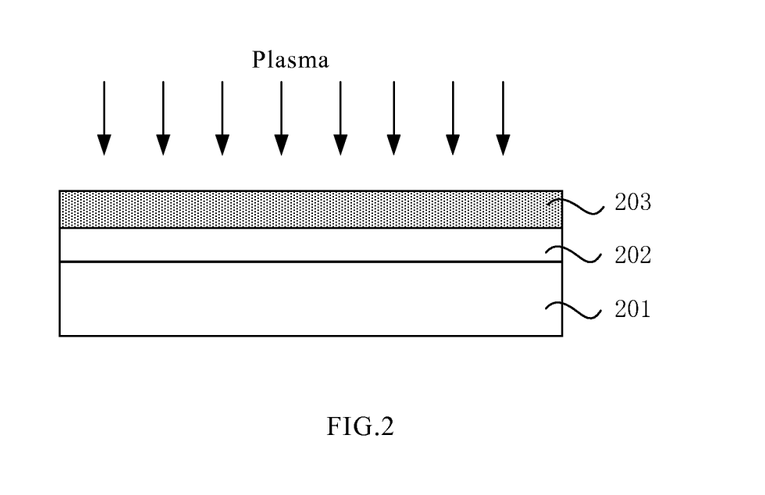
FIG. 2 is a schematic structural view of a first product in the first embodiment of the method for surface treatment on a metal oxide provided by the invention.
Figure 3:
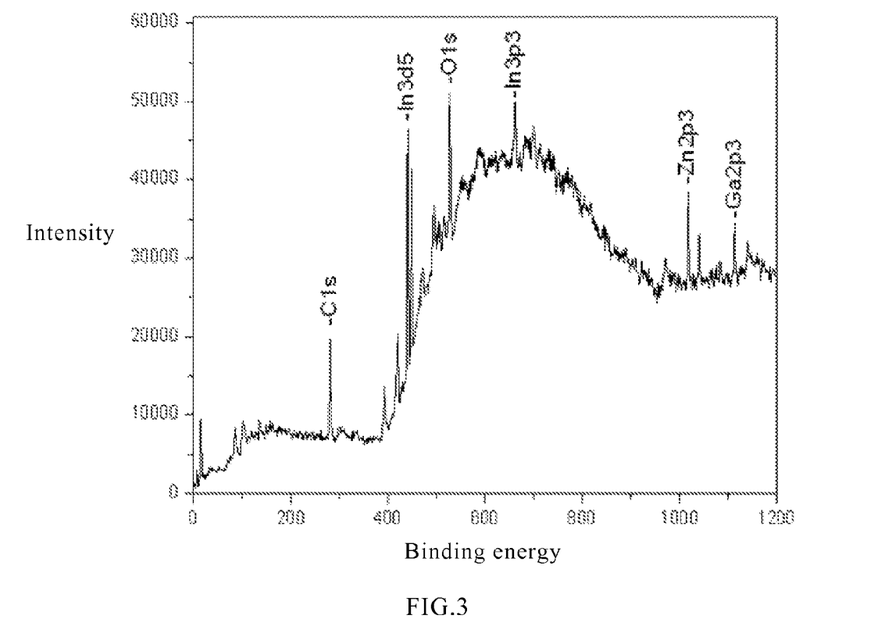
FIG. 3 is the XPS spectrum of the metal oxide processed in the embodiment.
Figure 4:
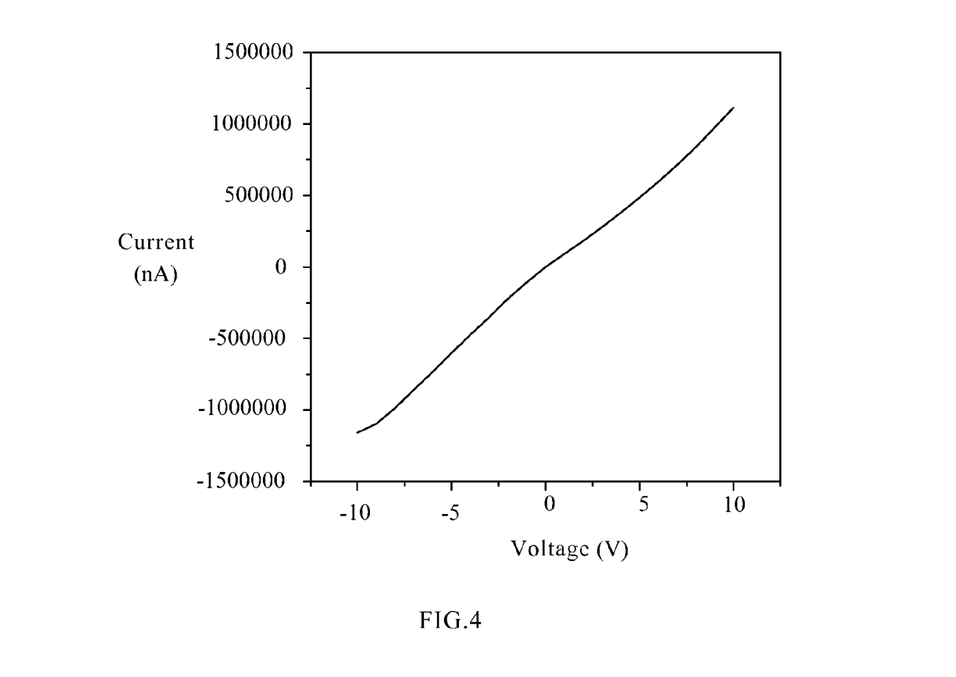
FIG. 4 is the I-V characteristic curve of the metal oxide processed in the embodiment.

Plasma can be utilized to perform a treatment on a device to be processed, and the device to be processed may be a metal oxide layer or a manufactured article coated with a metal oxide. In this embodiment, the technical solution is illustrated with a metal oxide layer as an example. FIG. 2 is a schematic structural view of a first product in the first embodiment of the method for surface treatment on a metal oxide provided by the invention, FIG. 3 is the XPS spectrum of the metal oxide processed in the embodiment, and FIG. 4 is the I-V characteristic curve of the metal oxide processed in the embodiment.

As shown in FIG. 2, on a substrate 201, there is deposited an insulating layer 202, and then on the insulating layer 202, there is prepared a metal oxide layer 203. The substrate 201 may be a glass substrate, a silicon wafer, or a polyethylene terephthalate (PET) substrate, etc., and the material of the insulating layer 202 may be $SiO_x$, $SiN_x$, SiON, $HfO_2$, or the like, and the metal oxide layer 203 may be prepared on the insulating layer 202 by way of sintering, sol-gel, plasma enhanced chemical vapor deposition (PECVD), or sputtering, etc. The material of the metal oxide layer 203 is a metal oxide semiconductor material, which may comprise pure zinc oxide, tin oxide, or zinc oxide based metal oxide or tin oxide-based metal oxide formed by doping indium (In), aluminum (Al), gallium (Ga) or hafnium (Hf) element or the like. In this embodiment, the metal oxide layer 203 is an IGZO (indium-gallium-zinc-oxide) thin film prepared by magnetron sputtering, and the sputtering atmosphere is a mixture gas of $O_2$ and Ar. The thickness of the prepared IGZO thin film is, for example, 400 Å.

Then, the lamination of the substrate 201, the insulating layer 202 and the metal oxide layer 203 is placed in a processing chamber; the processing chamber is filled with a mixture gas of an F-based gas and $O_2$ at pressure Y, and the $O_2$ content in the mixture gas is η; a RF at a power P is utilized to act on the mixture gas to obtain plasma, and the time in which the plasma acts on the metal oxide layer 203 is "t;" thus, by utilizing the strong oxidation of the F-based gas, the concentration of oxygen vacancy in the surface of the metal oxide layer 203 is increased.

For example, the F-based gas may comprise at least one gas of $CF_4$, $SF_6$, $NF_3$ and $C_2F_8$.

In this embodiment, the F-based gas may be $CF_4$, the pressure Y of the mixture gas of $CF_4$ and $O_2$ may be in a range of 40-400 mTorr, and the $O_2$ content η in the mixture gas is usually in a range of 0-38%. If the $O_2$ content is too high, it will affect the treatment on the oxygen atoms in the surface of the metal oxide layer 203. The power P of the output RF of the power supply in the processing chamber is in a range of 200-1500 W. The time "t" for performing the plasma treatment on the metal oxide is in a range of 5-120 s. In one example, for instance, the pressure Y of the mixture gas is 100 mTorr, the $O_2$ content η in the mixture gas is 20%, the power P of the output RF of the power supply in the processing chamber is 600 W, and the time "t" for performing plasma treatment on the metal oxide 203 is 10 s. In the processing chamber, the plasma produced from $CF_4$ and $O_2$ has chemical reactions with O atoms in the surface of the metal oxide 203 as follows:

$$CF_4 + O \rightarrow COF_2 + 2F \tag{1}$$

$$2O + F \rightarrow FO_2 \tag{2}$$

$$FO_2 + F \rightarrow F_2 + O_2 \tag{3}$$

As shown in FIG. 3, through an X-ray Photoelectron Spectroscopy Analysis (XPS) of the IGZO thin film through treatment with the plasma obtained from the mixture gas of $CF_4$ and $O_2$, it can be known that, there is no significant change occurring in the binding energy curves of a metal oxide, and there is no metal fluoride ingredients arisen.

Table 1 is a table showing the contents of each element atoms in the IGZO thin film before and after the plasma treatment.

| Name of Atoms | Percentage of the number of atoms before plasma treatment (%) | Percentage of the number of atoms after plasma treatment (%) |
|---|---|---|
| O1s | 82.08 | 69.80 |
| Zn2p3 | 5.13 | 6.26 |
| Ga2p3 | 1.57 | 2.49 |
| In3d5 | 11.22 | 21.45 |
| In:Ga:Zn:O | 7:1:3:52 | 9:1:3:28 |

As shown in Table 1, the IGZO thin film comprises elements of indium (In), gallium (Ga), zinc (Zn), and oxygen (O), etc. In the IGZO thin film which is not undergone the plasma treatment, the relative contents of the elements In:Ga:Zn:O is 7:1:3:52, whereas in the IGZO thin film after the plasma treatment, the relative contents of the elements In:Ga:Zn:O is 9:1:3:28. Therefore, by performing the plasma treatment on the IGZO thin film, the oxygen vacancy content in the IGZO thin film is greatly increased, which facilitates reducing the contact resistance of the IGZO thin film.

As shown in FIG. 4, the I-V characteristic curve of the IGZO thin film after the plasma treatment is a slanting line, indicating that the IGZO thin film comes into a good ohmic contact with an electrode. Therefore, the plasma treatment can effectively reduce the contact resistance between the IGZO thin film and the electrode to form ohmic contact, and can effectively improve the effect of forming ohmic contact between the IGZO film and the electrode.

Figure 5:
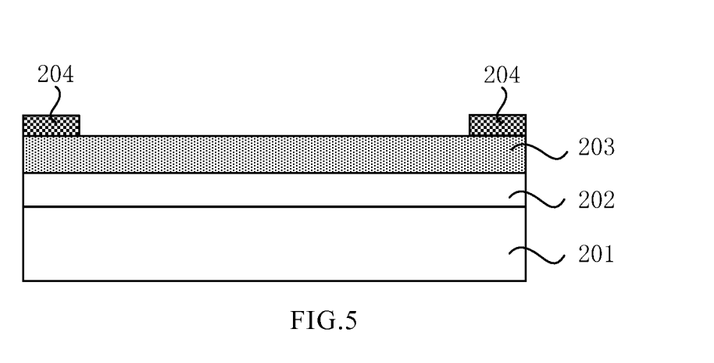
FIG. 5 is a schematic structural view of a second product in the first embodiment of the method for surface treatment on a metal oxide provided by the invention.

FIG. 5 is a schematic structural view of the sample in the first embodiment of the method for surface treatment on a metal oxide provided by the present invention. As shown in FIG. 5, at the four corners of the IGZO thin film after the plasma treatment described above, four metal indium electrodes 204 are led out respectively, and then an detection is performed for their electrical characteristics. Here, the number of the samples composed by the IGZO thin film and the metal indium electrodes is 5 in total.

Table 2 is a table showing the electrical characteristics of the sample composed of the IGZO thin film and the metal indium electrodes.

| Samples | Electrical resistivity (ohm · cm) | Hall mobility (cm$^2$/V · s) | Carrier concentration (1/cm$^3$) |
|---|---|---|---|
| 1 | 0.017075 | 17.201 | 2.128E+19 |
| 2 | 0.017572 | 16.658 | 2.1351E+19 |
| 3 | 0.02247 | 19.05 | 1.4601E+19 |
| 4 | 0.022552 | 18.925 | 1.4644E+19 |
| 5 | 0.023034 | 18.962 | 1.4309E+19 |

As shown in Table 2, from the electrical detection for the electrical characteristics of the sample composed of the IGZO thin film and the metal indium electrodes, it can be known that, the above-described semiconductor device has an electrical resistivity in the order of magnitude of $10^{-2}$ (ohm·cm), a carrier concentration in the order of magnitude of $10^{19}$ (cm$^{-3}$), and a Hall mobility in a range of 16.058-19.05 (cm$^2$/V·s). Compared to an IGZO thin film which has been not undergone the plasma treatment, the IGZO thin film after the plasma treatment has reduced electrical resistivity and greatly improved carrier concentration and Hall mobility.

In this embodiment, through utilizing plasma obtained from the mixture gas of an F-based gas and $O_2$ to perform a treatment on a metal oxide, it is possible to increase the concentration of oxygen vacancy in the metal oxide, reduce the contact resistance between a metal oxide and other electrodes, and improve the effect of ohmic contact of the metal oxide.

Figure 6:
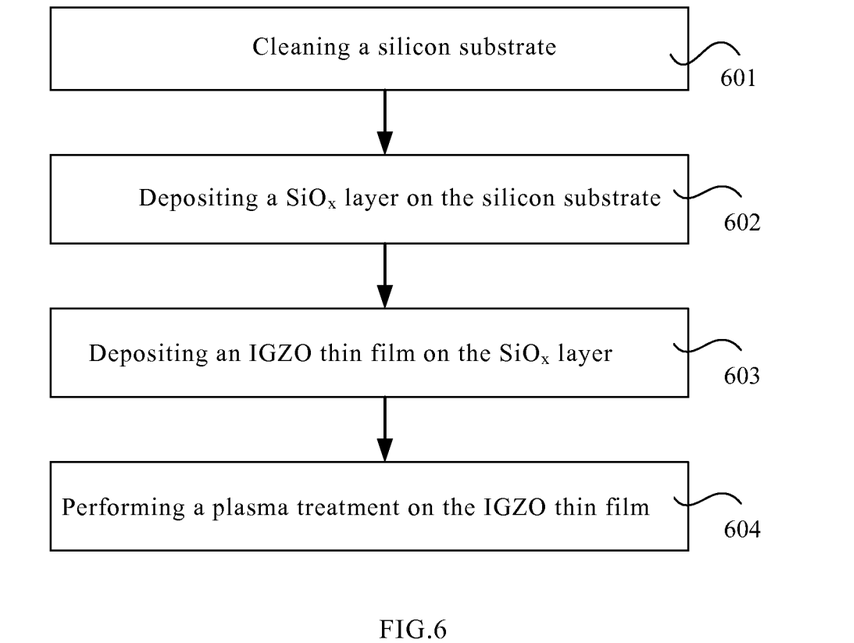
FIG. 6 is a flow chart of the second embodiment of the method for surface treatment on a metal oxide provided by the present invention.

FIG. 6 is a flow chart of the second embodiment of the method for surface treatment on a metal oxide provided by the present invention. As shown in FIG. 6, the procedure of the method for surface treatment on a metal oxide in this embodiment comprises the following steps.

Step 601, cleaning a silicon substrate.

In this step, a standard silicon wafer cleaning procedure is utilized to clean a silicon substrate, and the substrate is repeatedly rinsed with deionized water. Next, the procedure proceeds to Step 602.

Step 602, on the silicon substrate, depositing a layer of $SiO_x$.

In this step, on the silicon substrate, there is deposited a layer of $SiO_x$, for example, by way of PECVD, and the thickness of $SiO_x$ is, for example, 300 nm. Next, the procedure proceeds to Step 603.

Step 603, on the $SiO_x$ layer, depositing a layer of IGZO thin film.

In this step, in the mixture gas of $O_2$ and Ar, on the $SiO_x$ layer, there is deposited a layer of IGZO thin film, for example, by sputtering, and the thickness of the IGZO thin film is, for example, 400 Å. Next, the procedure proceeds to Step 604.

Step 604, performing a plasma treatment on the IGZO thin film.

In this step, in the chamber of a dry-etching apparatus, utilizing RF with an energy power of 1000 W to act on the mixture gas of $CF_4$ and $O_2$ to obtain plasma, the pressure of the mixture gas of $CF_4$ and $O_2$ in the chamber of the dry-etching apparatus is 100 mTorr, and the $O_2$ content in the above-described mixture gas is 20%; utilizing the above-described plasma to perform the treatment on the IGZO thin film, and the treatment time is 10 s.

In this embodiment, at the four corners of the IGZO thin film through the plasma treatment, electrodes are led out through metal molybdenum and indium tin oxide (ITO) respectively, and then a detection is performed for the electrical characteristics of the semiconductor device composed of the IGZO thin film and an metal molybdenum electrode, as well as the electrical characteristics of the semiconductor device composed of the IGZO thin film and an indium-tin oxide electrode, both with the number of samples being 2.

Table 3 is a table showing the electrical characteristics of the sample composed of the IGZO thin film and the metal molybdenum electrode.

| Samples | Electrical resistivity (ohm · cm) | Hall mobility (cm$^2$/V · s) | Carrier concentration (1/cm$^3$) |
|---|---|---|---|
| 1 | 0.0099946 | 15.594 | 4.0102E+19 |
| 2 | 0.0096056 | 20.844 | 3.1216E+19 |

As shown in Table 3, the semiconductor device composed by an IGZO thin film and metal molybdenum electrode has an electrical resistivity in the order of magnitude of $10^{-2}$ (ohm·cm), a carrier concentration in the order of magnitude of $10^{19}$ (cm$^{-3}$), and a Hall mobility in a range of 15.594-20.844 (cm$^2$/V·s).

Table 4 is a table showing the electrical characteristics of the sample composed of the IGZO thin film and the indium-tin oxide electrode.

| Samples | Electrical resistivity (ohm · cm) | Hall mobility (cm$^2$/V · s) | Carrier concentration (1/cm$^3$) |
|---|---|---|---|
| 1 | 0.02234 | 9.823 | 2.8481E+19 |
| 2 | 0.02225 | 11.740 | 2.3927E+19 |

As shown in Table 4, the semiconductor device composed by an IGZO thin film and an indium-tin oxide electrode has an electrical resistivity in the order of magnitude of $10^{-2}$ (ohm·cm), a carrier concentration in the order of magnitude of $10^{19}$ (cm$^{-3}$), and a Hall mobility in a range of 9.823-11.740 (cm$^2$/V·s).

In one example, for improving the effect of the plasma treatment, the plasma treatment can be performed for several times on the device to be processed.

In each of the above-described embodiments, with utilizing plasma obtained from $CF_4$ and $O_2$ to perform a treatment on an IGZO metal oxide, it is possible to increase the concentration of oxygen vacancy in the metal oxide, improve the Hall mobility and carrier concentration of the metal oxide, and reduce the contact resistance between the metal oxide and an electrode of molybdenum, indium-tin oxide or indium or the like, thereby achieving ohmic contact between an oxide semiconductor material and an electrode of molybdenum, indium-tin oxide or indium or the like.

Figure 7:
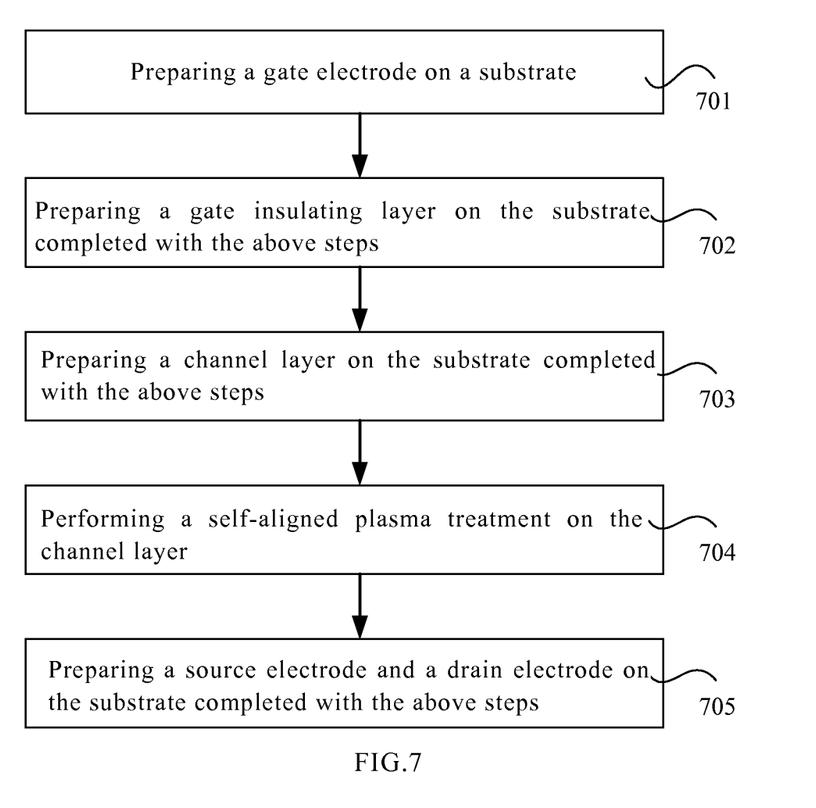
FIG. 7 is a flow chart of an embodiment of the method for preparing a thin film transistor provided by the present invention.
Figure 8:
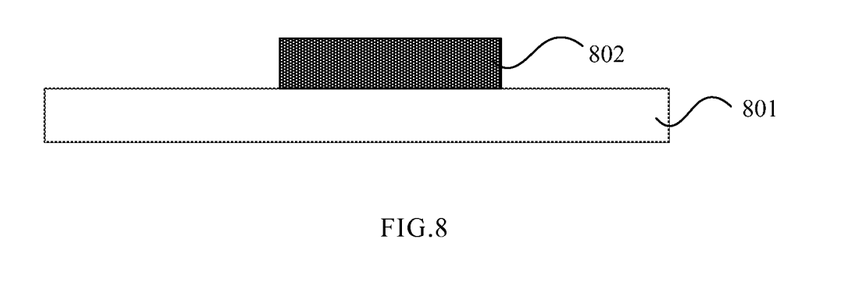
FIG. 8 is a first schematic structural view of a product in the method for preparing a thin film transistor provided by the present invention.
Figure 9:
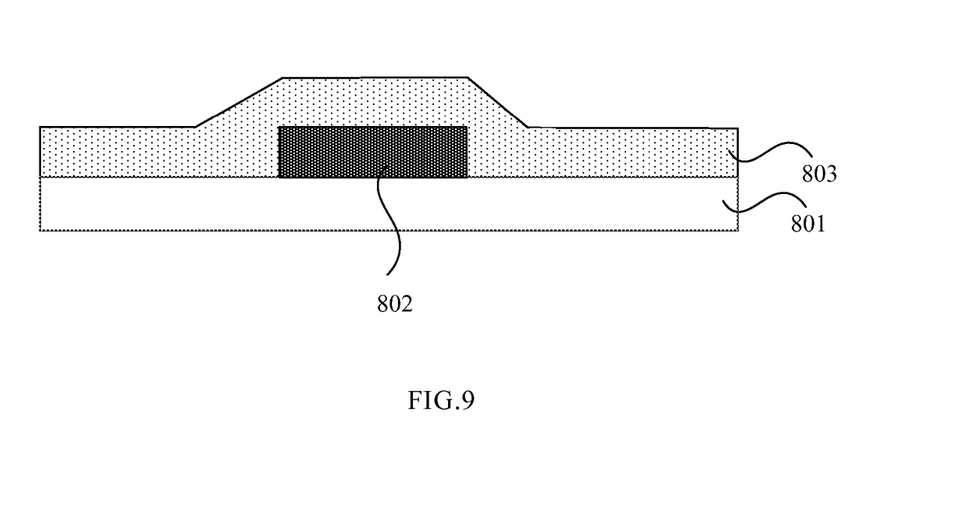
FIG. 9 is a second schematic structural view of the product in the method for preparing a thin film transistor provided by the present invention.
Figure 10:
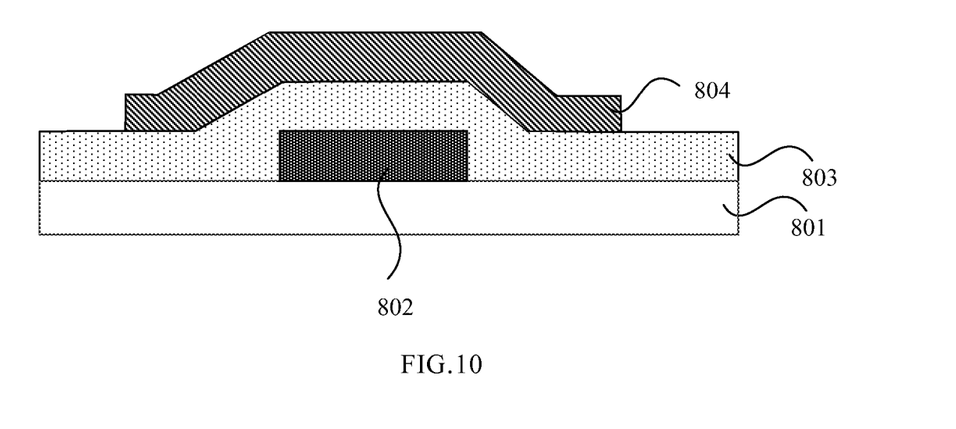
FIG. 10 is a third schematic structural view of the product in the method for preparing a thin film transistor provided by the present invention.
Figure 11:
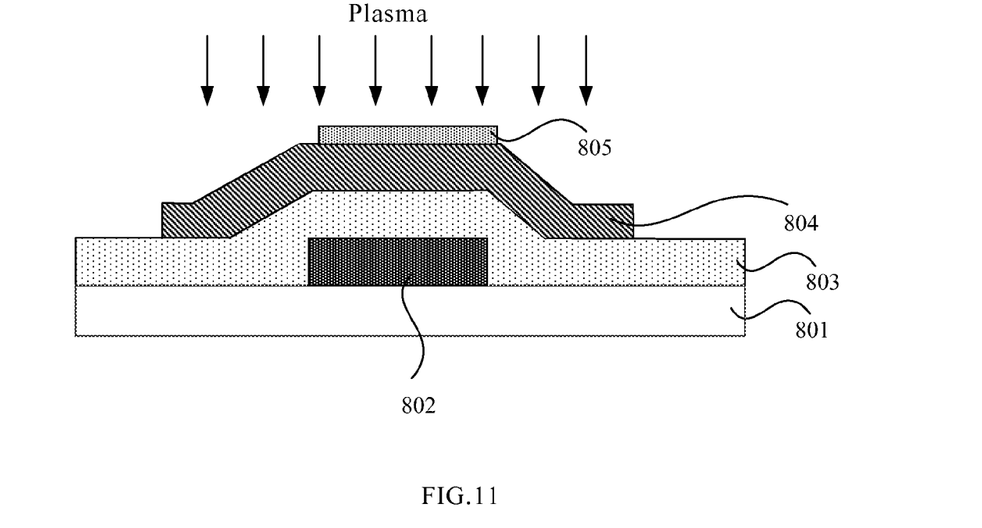
FIG. 11 is a fourth schematic structural view of the product in the method for preparing a thin film transistor provided by the present invention.
Figure 12:
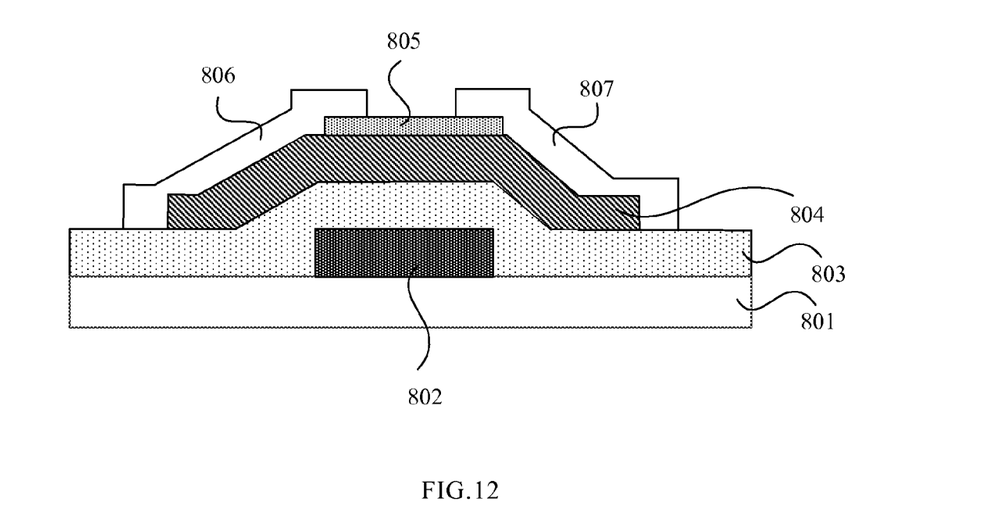
FIG. 12 is a fifth schematic structural view of the product in the method for preparing a thin film transistor provided by the present invention.

FIG. 7 is a flow chart of an embodiment of the method for preparing a thin film transistor provided by the present invention, FIG. 8 is a first schematic structural view of a product in the method for preparing a thin film transistor provided by the present invention, FIG. 9 is a second schematic structural view of the product in the method for preparing a thin film transistor provided by the present invention, FIG. 10 is a third schematic structural view of the product in the method for preparing a thin film transistor provided by the present invention, FIG. 11 is a fourth schematic structural view of the product in the method for preparing a thin film transistor provided by the present invention, and FIG. 12 is a fifth schematic structural view of the product in the method for preparing a thin film transistor provided by the present invention.

As shown in FIG. 7, the procedure of the method for preparing a thin film transistor in this embodiment comprises the following steps.

Step 701, preparing a gate electrode on a substrate.

In this step, for example, a glass substrate, a silicon wafer or a PET substrate or the like can be used as the substrate, and molybdenum, aluminum-rubidium alloy or gold-titanium alloy or the like can be used as a gate material. In this embodiment, the technical solution is illustrated with a glass substrate as the substrate and molybdenum as the gate material. As shown in FIG. 8, a layer of molybdenum thin film is deposited on a glass substrate 801 by way of sputtering, and then a gate electrode 802 is prepared through photolithography and wet-etching processes. Next, the procedure proceeds to Step 702.

Step 702, on the substrate completed with the above step, preparing a gate insulating layer.

In this step, as shown in FIG. 9, on the substrate 801 completed with the above step, there is deposited a gate insulating layer 803, for example, by way of thermal growth, PECVD, sputtering, or the like, and the material of the gate insulating layer 803 may be $SiO_x$, $Si_3N_4$, $AlO_x$, $TiO_x$, $HfO_2$, or the like. Then, the substrate deposited with the gate insulating layer is subject to an annealing process under nitrogen, oxygen or vacuum atmosphere, and the annealing temperature may be 400° C. Next, the procedure proceeds to Step 703.

Step 703, on the substrate completed with the above steps, preparing a channel layer.

In this step, as shown in FIG. 10, on the substrate 801 completed with the above steps, there is further deposited a layer of metal oxide as a channel layer 804; the channel layer 804 usually comprises a central region and two contact regions located on both sides of the central region, and the two contact regions are used for connecting with the source electrode and the drain electrode of the thin film transistor respectively. The metal oxide may be pure zinc oxide, pure tin oxide, or zinc oxide based metal oxide or tin oxide-based metal oxide formed by appropriately doping indium (In), aluminum (Al), gallium (Ga) or hafnium (Hf) or the like element. In this embodiment, IGZO is used as the channel layer 804. Next, the procedure proceeds to step 704.

Step 704, performing a self-aligned plasma treatment on the channel layer.

In this step, as shown in FIG. 11, firstly, through photolithography and dry-etching processes, a blocking layer 805 is prepared on the channel layer 804, forming a self-aligned structure, and the blocking layer 805 covers the central region of the channel layer 804 so as to prevent plasma from entering the central region during the plasma treatment on the channel layer 804, and the blocking layer 805 may be $SiO_x$, $Si_3N_4$, $AlO_x$, $TiO_x$, $HfO_2$ or any combination structure thereof.

In this embodiment, the F-based gas is $CF_4$, the pressure of the mixture gas of $CF_4$ and $O_2$ is Y, the $O_2$ content in the mixture gas is η, the power of the output RF of the power supply in the processing chamber is P, and the time in which the plasma performs treatment on the metal oxide is "t". In one example, the pressure Y of the mixture gas of $CF_4$ and $O_2$ may be in a range of 40-400 mTorr, the $O_2$ content η in the mixture gas is usually in a range of 0-38%, the $O_2$ content will affect the treatment on the oxygen atoms in the surface of the metal oxide layer 203 if it is too high, the power P of the output RF of a power supply in the processing chamber is in a range of 200-1500 W, and the time "t" for performing plasma treatment on the metal oxide is in a range of 5-120 s.

In this embodiment, the processing chamber is filled with the mixture gas of $CF_4$ and $O_2$. Preferably, the pressure of the mixture gas is 200 mTorr, the $O_2$ content in the mixture gas is 30%, the power of the output RF of the power supply in the processing chamber is 700 W, and the time "t" for performing plasma treatment on the channel layer 804 is 10 s. Next, the procedure proceeds to step 705.

Step 705, preparing a source electrode and a drain electrode on the substrate completed with above steps.

In this step, as shown in FIG. 12, on the substrate completed with the above steps, there is sputtered a metal thin film layer, and the material of the metal thin film may be indium (In), molybdenum (Mo), indium-tin oxide (ITO), or the like; then, the above-described metal thin film is subject to photolithography and wet-etching processes to obtain a source electrode 806 and a drain electrode 807; next, the above-described product is subject to an annealing process in a vacuum, nitrogen, or oxygen environment, and the annealing temperature may be between 120° C. and 400° C.; further, a passivation protective layer is deposited, thereby obtaining a thin film transistor.

In this embodiment, during the preparation of the thin film transistor, a blocking layer is used to form a self-aligned structure, and the plasma obtained from the mixture gas of an F-based gas and $O_2$ is employed to perform a treatment on a channel layer, and therefore it is possible to increase the concentration of oxygen vacancy in the channel layer, improve the contact characteristics of the channel layer, and reduce the contact resistance between the channel layer and the source and drain electrodes, thereby improving the Hall mobility and carrier concentration of the channel layer, which facilitates lowering a metal oxide device's power consumption.

For those ordinary skilled in the art, modifications and improvements can be made without departing from the spirit and essence of the disclosed technical solution. These modifications and improvements should also be regarded as within the scope of protection of the present invention.

The invention claimed is:

1. A method for surface treatment on a metal oxide semiconductor, comprising:
   utilizing plasma to perform a surface treatment on a device to be processed; and
   wherein the plasma comprises a mixture gas of an F-based gas and $O_2$, and the device to be processed is a metal oxide semiconductor layer or a manufactured article coated with the metal oxide semiconductor to allow concentration of oxygen vacancy therein being increased.

2. The method for surface treatment on a metal oxide semiconductor according to claim 1, wherein the metal oxide semiconductor comprises zinc oxide, tin oxide, zinc oxide based metal oxide containing at least one element of indium, aluminum and gallium, or tin oxide-based metal oxide containing at least one element of the indium, aluminum and gallium.

3. The method for surface treatment on a metal oxide semiconductor according to claim 1, wherein the utilizing plasma to perform a surface treatment on a device to be processed comprises:
   filling a chamber, in which the device to be processed is placed, with the mixture gas of an F-based gas and $O_2$ at pressure Y, an $O_2$ content in the mixture gas being η;
   utilizing RF at a power P to act on the mixture gas to obtain plasma; and
   a period of time in which the plasma acts on the device to be processed is "t".

4. The method for surface treatment on a metal oxide semiconductor according to claim 1, wherein the F-based gas comprises at least one gas of $CF_4$, $SF_6$, $NF_3$ and $C_2F_8$.

5. The method for surface treatment on a metal oxide semiconductor according to claim 4, wherein the F-based gas is $CF_4$;
   wherein an $O_2$ content n in the mixture gas of $CF_4$ and $O_2$ is in a range of 0<η≤38%;
   a pressure Y of the mixture gas of $CF_4$ and $O_2$ is in a range of 40-400 mTorr;
   a period of time "t" in which the plasma acts on the device to be processed is in a range of 5-120 s; and
   a power P of the RF is in a range of 200-1500 W.

6. A method for preparing a thin film transistor, comprising: preparing a gate electrode, a gate insulating layer, a channel layer, a blocking layer, a source electrode, a drain electrode and a passivation protective layer on a substrate in order, preparation of the channel layer comprising:
   utilizing plasma to perform surface treatment on the channel layer to allow concentration of oxygen vacancy in the channel layer being increased;
   the plasma comprises a mixture gas of an F-based gas and $O_2$, wherein the material of the channel layer s a metal oxide semiconductor.

7. The method for preparing a thin film transistor according to claim 6, wherein the metal oxide comprises: zinc oxide, tin oxide, zinc oxide based metal oxide containing at least one element of indium, aluminum and gallium, or tin oxide-based metal oxide containing at least one element of the indium, aluminum and gallium.

8. The method for preparing a thin film transistor according to claim 6, wherein the utilizing plasma to perform surface treatment on the channel layer comprises:
   placing a product, a surface of which is a channel layer, into a chamber filled with a mixture gas of an F-based gas and $O_2$ at pressure Y, an $O_2$ content in the mixture gas being η; and
   utilizing RF at a power P to act on the mixture gas to obtain plasma; and
   a period of time in which the plasma acts on the channel layer to be processed is "t".

9. The method for preparing a thin film transistor according to claim 6, wherein the channel layer comprises a central region and two contact regions for contacting the source-drain respectively, the two contact regions being on both sides of the central region; and
   the blocking layer is deposited in the position of the central region on the channel layer, for blocking the plasma from reaching the central region of the channel layer.

10. The method for preparing a thin film transistor according to claim 6, wherein the F-based gas is $CF_4$;
    an $O_2$ content n in the mixture gas of $CF_4$ and $O_2$ is in a range of 0<η≤38%;
    a pressure Y of the mixture gas of $CF_4$ and $O_2$ is in a range of 40-400 mTorr;
    a period of time "t" in which the plasma acts on the channel layer to be processed is in a range of 5-120 s; and
    a power P of the RF is in a range of 200-1500 W.

11. A method for preparing a thin film transistor, comprising:
    preparing a gate electrode, a gate insulating layer, a channel layer, a blocking layer, a source electrode, a drain electrode and a passivation protective layer on a substrate in order, preparation of the channel layer comprising:
    utilizing plasma to perform surface treatment on the channel layer to allow concentration of oxygen vacancy the channel layer being increased; the plasma comprises a mixture gas of an F-based gas and $O_2$, wherein the material of the channel layer is a metal oxide semiconductor;
    wherein the F-based gas is $CF_4$;
    an $O_2$ content η in the mixture gas of $CF_4$ and $O_2$ is in a range of 0<η≤38%;
    a pressure Y of the mixture gas of $CF_4$ and $O_2$ is in a range of 40-400 mTorr;
    a period of time "t" in which the plasma acts on the channel layer to be processed is in a range of 5-120 s; and
    a power P of the RF is in a range of 200-1500 W.

12. The method for preparing a thin film transistor according to claim 11, wherein material of the channel layer comprises: zinc oxide, tin oxide, zinc oxide based metal oxide containing at least one element of indium, aluminum and gallium, or tin oxide-based metal oxide containing at least one element of the indium, aluminum and gallium.

13. The method for preparing a thin film transistor according to claim 11, wherein the channel layer comprises a central region and two contact regions for contacting the source-drain respectively, the two contact regions being on both sides of the central region; and
    the blocking layer is deposited in the position of the central region on the channel layer, for blocking the plasma from reaching the central region of the channel layer.

14. The method for preparing a thin film transistor according to claim 11, wherein the F-based gas further comprises at least one gas of $SF_6$, $NF_3$ and $C_2F_8$.

* * * * *